United States Patent [19]

Roggwiller et al.

[11] Patent Number: 4,642,669
[45] Date of Patent: Feb. 10, 1987

[54] SEMICONDUCTOR DEVICE HAVING A BLOCKING CAPABILITY IN ONLY ONE DIRECTION

[75] Inventors: Peter Roggwiller, Riedt-Neerach; Roland Sittig, Umiken, both of Switzerland

[73] Assignee: BBC Brown, Boveri & Company Limited, Baden, Switzerland

[21] Appl. No.: 679,359

[22] Filed: Dec. 7, 1984

[30] Foreign Application Priority Data

Dec. 7, 1983 [CH] Switzerland .................... 6544/83

[51] Int. Cl.$^4$ ........................................... H01L 29/34
[52] U.S. Cl. ........................................ 357/52; 357/20; 357/38; 357/55; 357/56; 357/89; 357/90
[58] Field of Search ................... 357/20, 52, 55, 56, 357/89, 90, 38

[56] References Cited

U.S. PATENT DOCUMENTS

| | | | |
|---|---|---|---|
| 3,370,209 | 2/1968 | Davis et al. | 357/55 |
| 3,449,826 | 6/1969 | Eugster et al. | 357/55 |
| 3,495,138 | 2/1970 | Bradley | 357/56 |
| 3,697,829 | 10/1972 | Huth et al. | 357/55 |
| 4,214,255 | 7/1980 | Neilson | 357/56 |
| 4,255,757 | 3/1981 | Hikin | 357/52 |
| 4,517,582 | 5/1985 | Sittig | 357/89 |

*Primary Examiner*—Joseph E. Clawson, Jr.
*Attorney, Agent, or Firm*—Oblon, Fisher, Spivak, McClelland & Maier

[57] ABSTRACT

For improving the dynamic characteristics of semiconductor components required to absorb high reverse voltages only in one polarity (diodes, reverse-conducting thyristors and asymmetric thyristors), in many cases structures having an n base consisting of two layers are used. In order to improve the reverse-voltage capability, it is proposed, in a semiconductor component having at least one pn⁻n sequence of layers, to select the thickness (S) and the doping of an n stop layer (4) in such a way that the following applies:

$$\frac{e}{\epsilon} \int_0^S N_D(x)dx = k\, E_n$$

where e=elementary charge, $\epsilon$=dielectric constant of the semiconductor, $N_D$=donor concentration, X=path coordinate, $0.8 \leq k \leq 1.0$ and $E_n$=field strength at the n⁻n junction. The effect of this measure is that the geometric conditions of the edge chamfering are less stringent. The edge can also be shaped by means of conventional etching processes.

5 Claims, 6 Drawing Figures

SEMICONDUCTOR DEVICE HAVING A BLOCKING CAPABILITY IN ONLY ONE DIRECTION

BACKGROUND OF THE INVENTION

Field of the Invention

This invention relates to a semiconductor device known, for example, from the Proceedings of the 29th Electronic Component Conference (Cherry Hill, NJ, USA; 14 to 16 May 1979), pages 75 to 79.

The above-noted paper, an asymmetrical thyristor having a p+n+npn+ structure is described. Between the p+ layer and the p layer, a thick n layer with a low level of doping and a thin highly doped n+ layer are provided, the latter acting as a so-called "stop layer". It limits the extent of the space charge zone. In this manner, a p-i-n structure is produced in the component. The edge of the component is chamfered slightly in the positive direction. A second more positive chamfering of the edge is provided in the region of the p layer. These chamferings are intended to prevent a voltage breakdown in the edge region so that higher reverse voltages can be applied to the component. The angles are determined by means of the doping profile. They require careful mechanical edge machining and lead to a relatively large loss of effectively usable area.

SUMMARY OF THE INVENTION

Accordingly, one object of this invention is to provide a novel semiconductor component having a high reverse voltage and lower losses of effective usable area and facilitating production.

A significant advantage of the invention consists in the fact that the angles of the chamferings are not critical for shaping the edge contours of the abovementioned semiconductor components. This makes it possible to use a conventional etching process for the contouring, instead of a mechanical edge machining process. The important factor is the number of doped atoms in the stop layer which can be achieved without problems by ion implantation. The invention is applicable to all semiconductor components needing to accommodate high reverse voltages in only one polarity, especially diodes, reverse-conducting thyristors and asymmetric thyristors.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein:

FIG. 1b is a graph showing the field strength and doping along line A—A of FIG. 1a;

FIG. 2b is a graph showing the field strength and doping along lines X—X and Y—Y of FIG. 2a;

DESCRIPTION OF THE PREFERRED EMBODIMENTS

Figure 1A:
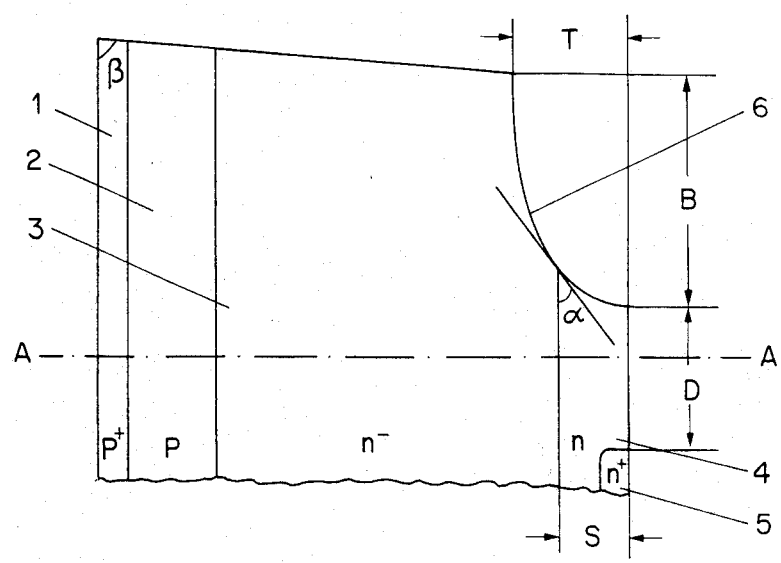
FIG. 1a is a a partial cross-sectional view through a first diode structure according to the invention.

Referring now to the drawings, wherein like reference numerals designate identical or corresponding parts throughout the several views, FIG. 1a shows the layer structure of a disk-shaped component according to the invention, having a diode structure with two end surfaces which are essentially parallel to each other, which component consists of a highly doped p+ emitter 1 on the anode side, a p region 2 with lower doping, an n− zone 3 with low doping, an n layer 4 (stop layer) with higher doping and a highly doped n+ emitter 5 on the cathode side. On the side of the n+ emitter 5, a recess 6 is provided at the edge of the component in the region of the n− zone 3 and the n layer 4, which recess is characterized by a depth T, a width B and an angle α. In this arrangement, T is the maximum depth from the plane of the cathode-side surface of the component, B is the width to which the stop layer 4 has been completely removed, from the edge of the component to the n−n transition, and α is the angle between the tangent at the n−n transition and the cathode-side surface of the component. The edge of the component forms at the pn junction an angle β with respect to the surface of the p+ emitter 1, with $30° \leq \beta \leq 120°$. This angle β is usually about 90°. D designates the width to which, from the n+ emitter 5, the n layer 4 is completely retained, measured at the surface of the component. The n layer 4, the so-called stop layer, has a thickness S which is measured from the cathode-side surface of the n layer 4 to the adjoining n− zone 3, that is to say to the point at which the n concentration is higher by 10% than the n− concentration of the n− zone 3.

Figure 1B:
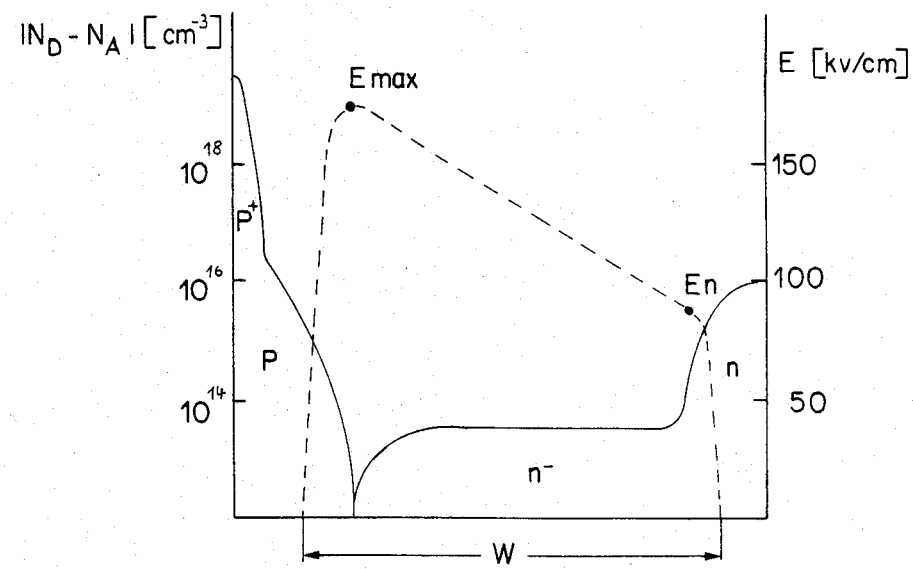

In FIG. 1b, the continuous line shows the doping characteristic and the dashed line the electric field strength with maximum voltage applied to the component along section A—A in FIG. 1a. The field-strength E is plotted on the right-hand ordinate, the donor concentration $N_D$ and the acceptor concentration $N_A$ on the left-hand ordinate. The abscissa is related to the width of the component and matches FIG. 1a. The space charge zone extends over a width W. This width W is defined by the width of the base zone, with low-level doping, of the component, that is to say comprises the width of the n− zone 3 and of the part with low-level doping of the p region 2, and is between 50 μm and 800 μm. For D>2W, the maximum field strength $E_{max}$ occurs at a great distance from the surface at the pn junction between the p region 2 and the n− zone 3 and is $1.7 \times 10^5$ V/cm to $2.2 \times 10^5$ V/cm with high-reverse-voltage components. The field strength at the edge of the stop layer 4 is designated by $E_n$ and is $E_n = 0.5\ E_{max} \approx 10^5$ V/cm with the usual dimensions. The thickness S of the stop layer 4 and its donor doping are selected in such a manner that the following applies:

$$\frac{e}{\epsilon} \int_0^S N_D(x)\, dx = k\, E_n \tag{1}$$

where
  e = elementary charge,
  ε = dielectric constant of the semiconductor material (silicon)
  $N_D(x)$ = donor concentration of the stop layer 4 in cm$^{-3}$, and
  k = constant, selected within a range of $0.8 \leq k \leq 1.0$.

The integral must be extended over the entire thickness of the n layer 4 (outside the n+ emitter 5). The maximum field strength $E_{max}$ at the pn junction between the p region 2 and the n− zone 3 is predetermined by the dimensioning and the doping of the component and is determined at the breakdown voltage (see, for example, Sze, Physics of Semiconductors, Wiley International, N.Y. (1969), Chapter III). The same applies to the field strength $E_n$ at the edge of the stop layer 4. In particular, $V_B=0.7\ E_{max}W$ applies for the breakdown voltage in the component described. For $E_n=10^5$ V/cm, for example, a total quantity of doping atoms within a range of from $5.0\times10^{11}$ atoms/cm³ to $6.25\times10^{11}$ atoms/cm³ is obtained in the stop layer 4. The distances D and B are preferably selected in such a way that $D\geq W$ and $B\geq W$. The depth T is greater than S; preferably, $S<T<W/2$ is selected. With defect-free material, the thickness S of the stop layer 4 is uncritical and about twice as large as the depth of penetration of the n+ emitter 5, that is to say between 10 μm and 30 μm. It has been found that, under the conditions mentioned, the angles α and β can be varied within wide ranges without decreasing the reverse-voltage capability of the component. Especially the following ranges have been found successful:

$$10°<\alpha<60° \text{ and } 30°\leq\beta\leq120° \qquad (2)$$

Because the contouring of the edge of the component according to the invention is largely uncritical, the customary etching processes can now be used for this purpose. The quantity of dopant of the stop layer 4 should be observed to an accuracy of ±10%, which is no problem with the customary ion implantation technology. With the abovementioned measures, the loss of area can be restricted to an edge zone of approximately $B+D\approx2W$.

Figure 2A:
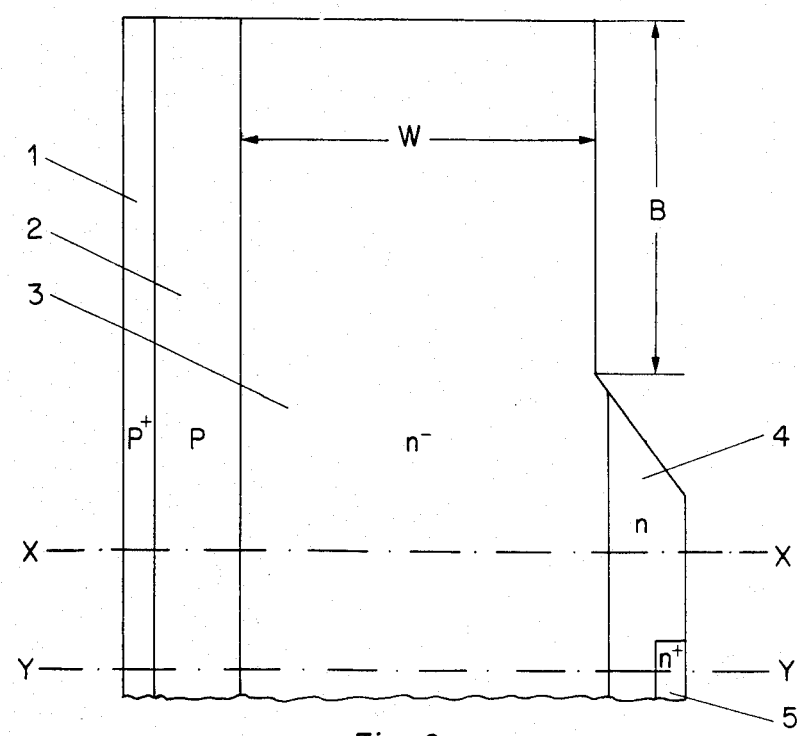
FIG. 2a is a partial cross-sectional view through a second diode structure according to the invention.

FIG. 2a shows a diode according to the invention, having a pn−n structure. The reference symbols have the same meaning as in FIG. 1a. The distance of the n− zone 3 from the cathode-side surface is 30 μm. The donor concentration of the stop layer 4 has $6\times10^{14}$ atoms/cm³. The width B at the edge at which the stop layer 4 has been completely removed corresponds to the width W of the n− zone 3.

Figure 2B:
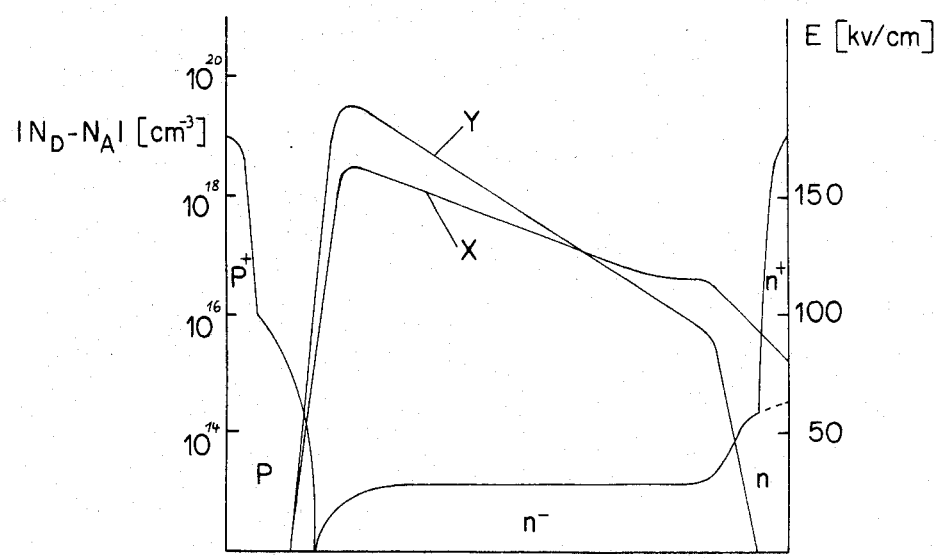

In FIG. 2b, the characteristic of the doping and of the electric field strength has been plotted with a reverse voltage of 3600 V. The reference symbols correspond to FIG. 1. The curves X and Y of the electric field strength E correspond to sections X—X and Y—Y of FIG. 2a.

For thyristors, the stop layer must have a much higher total quantity of doped impurities in the region of the p+ emitter than is required by formula (1). This means that the stop layer is there dimensioned as usual, for example has a thickness of 40 μm and a doping of $2\times10^{16}$ atoms/cm³.

Figure 3:
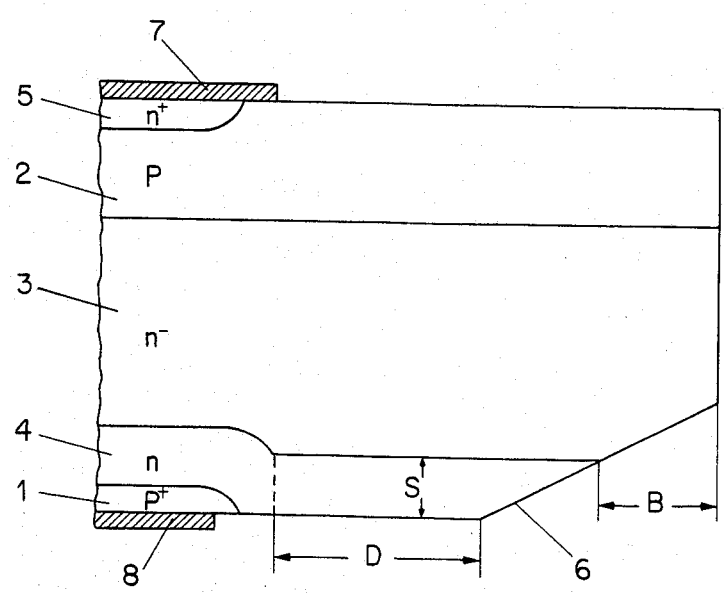
FIG. 3 is a partial cross-sectional view through a first thyristor structure according to the invention.
Figure 4:
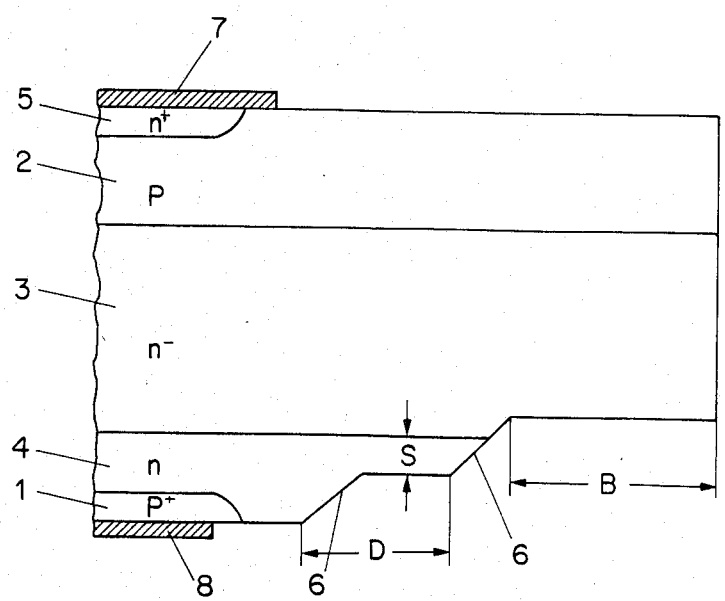
FIG. 4 is a partial cross-sectional view through a second thyristor structure according to the invention.

FIGS. 3 and 4 show two design possibilities for an asymmetric thyristor. The designations in FIGS. 3 and 4 are identical to those in FIG. 1a. The doping profiles outside the region of the p+ emitter again correspond to those of FIGS. 1b and 2b. In addition, a metallized cathode layer 7 and a metallized anode layer 8 are applied.

In the first variant of FIG. 3, two different stop layers 4 are provided, or one stop layer with regions of different donor concentration. In the outer edge region, having approximately the width D, the donor concentration of the stop layer corresponds to formula (1). In the p+ emitter region, the donor concentration is increased.

In the second variant of FIG. 4, only the stop layer 4 with higher-level doping, required for the thyristor, is diffused in. In the edge region, this stop layer has been removed in steps via a recess 6 and an additional recess 6' to such an extent that the space charge zone in this area extends just to the anode-side surface. This achieves the same effect as in the embodiment of FIG. 3.

In summary, it must be noted again that the concept according to the invention essentially consists, in the case of semiconductor components cutting off in only one polarity, such as diodes, reverse-conducting and asymmetric thyristors having a pn−n sequence of layers, of doping the n region, acting as a stop layer, in accordance with the formula (1) and contouring it in a suitable manner at the edge. In contrast to the prior art, this edge contouring is not located at the blocking pn junction, therefore, but at the side of the n−n sequence of layers facing away from this junction.

Obviously, numerous modifications and variations of the present invention are possible in light of the above teachings. It is therefore to be understood that within the scope of the appended claims, the invention may be practiced otherwise than as specifically described herein.

What is claimed as new and desired to be secured by Letters Patent of the United States is:

1. A semiconductor device having a blocking capbility in only one direction, comprisng:
   an anode;
   a cathode;
   a plurality of differently doped layers stacked along a main axis between said anode and said cathode, said doped layers including,
   a first highly doped p+ layer provided aside said anode,
   a second highly doped n+ layer provided aside said cathode,
   a third layer with a low-level n− doping provided between said first and second layers,
   a fourth n-doped stopping layer with a doping concentration lying in between the doping concentrations of said second and third layers provided adjoining said third layer on one side,
   wherein said stopping layer has a thickness S and a number of donor atoms selected so as to satisfy the equation:

$$\frac{e}{\epsilon}\int_0^S N_D(x)dx = k\cdot E_n$$

with
e = elementary charge
ε = dielectric constant of the semiconductor material of said device,
$N_D$ = donor concentration in said stopping layer (in cm⁻³),
x = path coordinate of an integration path parallel to said main axis of said device (in cm),
k = numerical constant with $0.8\leq K\leq 1.0$,
$E_n$ = electrical field strength at the junction between said third and fourth layers at the breakdown voltage of said device; and
a recess provided at the edge of said stopping layer.

2. The semiconductor device as claimed in claim 1, wherein said recess has the following properties:

$$B \geq W \text{ and } S \leq T \leq W/2,$$

with
- B = lateral extension of said recess in a region where said stopping layer has been completely removed,
- W = thickness of the space charge zone of the pn-junction of said device at the breakdown voltage of said device,
- T = maximum depth of said recess parallel to said main axis measured from the cathode surface plane.

3. The semiconductor device as claimed in claim 2, wherein:
- said stopping layer is located between said third and second layers;
- said second layer is embedded into said stopping layer;
- between the edge of said second layer and said recess a distance D remains in which said stopping region is retained; and
- said distance D is equal to or greater than said thickness W of said space charge zone.

4. The semiconductor device as claimed in claim 2, comprising:
- said stopping layer located between said third and first layers;
- a fifth p-doped layer adjoining said third layer on the other side of said third layer;
- said first layer embedded into said stopping layer; and
- the donor concentration of said stopping layer increased in a region near said first layer with respect to a region far from said first layer, whereby the donor concentration in said letter region corresponds to the donor concentration of said integral equation.

5. The semiconductor device as claimed in claim 2, comprising:
- said stopping layer located between said third and first layers;
- a fifth p-doped layer adjoining said third layer on the other side of said third layer;
- said first layer embedded into said stopping layer; and
- an additional recess provided in an edge region of said stopping layer, said additional recess reducing said thickness S of said stopping layer in the region of the junction of the stopping layer with said third layer to such an extent that said space charge zone extends to a surface at the side of said anode.

* * * * *